(12) United States Patent
Umeda et al.

(10) Patent No.: US 8,692,292 B2
(45) Date of Patent: Apr. 8, 2014

(54) SEMICONDUCTOR DEVICE INCLUDING SEPARATED GATE ELECTRODE AND CONDUCTIVE LAYER

(75) Inventors: Hidekazu Umeda, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/356,156

(22) Filed: Jan. 23, 2012

(65) Prior Publication Data

US 2012/0119261 A1    May 17, 2012

Related U.S. Application Data

(63) Continuation of application No. PCT/JP2010/004515, filed on Jul. 12, 2010.

(30) Foreign Application Priority Data

Jul. 28, 2009 (JP) ................................. 2009-175621

(51) Int. Cl.
*H01L 29/66* (2006.01)

(52) U.S. Cl.
USPC ........................................................ 257/194

(58) Field of Classification Search
CPC ................... H01L 29/1029; H01L 29/66462; H01L 29/7786; H01L 29/1066; H01L 29/2003; H01L 29/402
USPC ........................................................ 257/194
See application file for complete search history.

(56) References Cited

U.S. PATENT DOCUMENTS

| 5,777,350 | A  | * | 7/1998 | Nakamura et al. | 257/96 |
| 6,281,528 | B1 | * | 8/2001 | Wada | 257/200 |
| 6,933,544 | B2 | * | 8/2005 | Saito et al. | 257/194 |
| 6,963,090 | B2 | * | 11/2005 | Passlack et al. | 257/187 |
| 7,038,252 | B2 | * | 5/2006 | Saito et al. | 257/192 |
| 7,071,498 | B2 | * | 7/2006 | Johnson et al. | 257/192 |

(Continued)

FOREIGN PATENT DOCUMENTS

| JP | 2001-102565 A | 4/2001 |
| JP | 2006-513580 | 4/2006 |

(Continued)

OTHER PUBLICATIONS

International Search Report issued in International Patent Application No. PCT/JP2010/004515 dated Oct. 12, 2010.

*Primary Examiner* — Kimberly Rizkallah
*Assistant Examiner* — Caleb Henry
(74) *Attorney, Agent, or Firm* — McDermott Will & Emery LLP

(57) ABSTRACT

A semiconductor device includes: a substrate 101, a first nitride semiconductor layer 104S which includes a plurality of nitride semiconductor layers formed on the substrate 101, and has a channel region; a second semiconductor layer 105 which is formed on the first nitride semiconductor layer 104S, and has a conductivity type opposite a conductivity type of the channel region; a conductive layer which is in contact with the second semiconductor layer 105, and includes a metal layer 107 or a high carrier concentration semiconductor layer having a carrier concentration of $1 \times 10^{18}$ cm$^{-3}$ or higher; an insulating layer 110 formed on the conductive layer; a gate electrode 111 formed on the insulating layer 110; and a source electrode 108 and a drain electrode 109 formed to laterally sandwich the second semiconductor layer 105.

12 Claims, 10 Drawing Sheets

(56) References Cited

U.S. PATENT DOCUMENTS

| | | | |
|---|---|---|---|
| 7,132,699 B2* | 11/2006 | Kimura et al. | 257/192 |
| 7,244,974 B2* | 7/2007 | Saito et al. | 257/194 |
| 7,388,236 B2* | 6/2008 | Wu et al. | 257/194 |
| 7,508,015 B2* | 3/2009 | Saito et al. | 257/192 |
| 7,573,078 B2* | 8/2009 | Wu et al. | 257/194 |
| 7,576,373 B1* | 8/2009 | Hikita et al. | 257/192 |
| 7,629,627 B2* | 12/2009 | Mil'shtein et al. | 257/192 |
| 7,800,131 B2* | 9/2010 | Miyamoto et al. | 257/192 |
| 7,816,707 B2* | 10/2010 | Hikita et al. | 257/192 |
| 7,855,401 B2* | 12/2010 | Sheppard et al. | 257/194 |
| 7,863,648 B2* | 1/2011 | Miyamoto et al. | 257/192 |
| 7,863,649 B2* | 1/2011 | Hikita et al. | 257/194 |
| 7,898,002 B2* | 3/2011 | Hikita et al. | 257/192 |
| 7,928,475 B2* | 4/2011 | Parikh et al. | 257/194 |
| 8,212,290 B2* | 7/2012 | Heikman et al. | 257/195 |
| 2001/0013604 A1 | 8/2001 | Hase | |
| 2004/0238842 A1* | 12/2004 | Micovic et al. | 257/192 |
| 2005/0087765 A1* | 4/2005 | Saito et al. | 257/192 |
| 2005/0110042 A1 | 5/2005 | Saito et al. | |
| 2005/0189559 A1* | 9/2005 | Saito et al. | 257/189 |
| 2006/0060871 A1* | 3/2006 | Beach | 257/94 |
| 2006/0138454 A1* | 6/2006 | Saito et al. | 257/192 |
| 2006/0273347 A1 | 12/2006 | Hikita et al. | |
| 2007/0045670 A1* | 3/2007 | Kuraguchi | 257/249 |
| 2007/0051979 A1* | 3/2007 | Kambayashi et al. | 257/194 |
| 2007/0157876 A1* | 7/2007 | Minemoto et al. | 117/109 |
| 2007/0164314 A1* | 7/2007 | Beach et al. | 257/194 |
| 2007/0170463 A1* | 7/2007 | Ueno et al. | 257/192 |
| 2007/0278507 A1* | 12/2007 | Nakazawa et al. | 257/94 |
| 2008/0121896 A1* | 5/2008 | Takizawa et al. | 257/76 |
| 2008/0179694 A1 | 7/2008 | Nakazawa et al. | |

FOREIGN PATENT DOCUMENTS

| | | |
|---|---|---|
| JP | 2006-339561 | 12/2006 |
| JP | 2008-053312 | 3/2008 |
| JP | 2008-053312 A | 3/2008 |
| JP | 2008-305894 | 12/2008 |
| JP | 2008-305894 A | 12/2008 |
| JP | 2010-067816 | 3/2010 |
| JP | 2010-067816 A | 3/2010 |

* cited by examiner

SEMICONDUCTOR DEVICE INCLUDING SEPARATED GATE ELECTRODE AND CONDUCTIVE LAYER

CROSS-REFERENCE TO RELATED APPLICATION

This is a continuation of PCT International Application PCT/JP2010/004515 filed on Jul. 12, 2010, which claims priority to Japanese Patent Application No. 2009-175621 filed on Jul. 28, 2009. The disclosures of these applications including the specifications, the drawings, and the claims are hereby incorporated by reference in their entirety.

BACKGROUND

The present disclosure relates to semiconductor devices, particularly to a semiconductor device including a nitride semiconductor transistor which is applicable to power transistors used in power supply circuits in consumer products.

Group III nitride semiconductors are wide gap semiconductors. For example, band gaps of gallium nitride (GaN) and aluminum nitride (AlN) at room temperature are as large as 3.4 eV, and 6.2 eV, respectively. The group III nitride semiconductors have a high breakdown field, and a higher electron saturation velocity than arsenic semiconductors such as gallium arsenide (GaAs), etc., and semiconductors such as silicon (Si), etc. For these reasons, researches and developments have been in progress to use field effect transistors (FETs) using GaN-based nitride semiconductors as high frequency electronic devices or high output electronic devices.

The GaN-based nitride semiconductors can provide various types of mixed crystals with AlN or indium nitride (InN), and a heterojunction can be formed like the conventional arsenic semiconductors, such as GaAs. In a heterostructure using the GaN-based nitride semiconductor, e.g., an AlGaN/GaN heterostructure, high concentration carriers are generated at a heterointerface by spontaneous polarization and piezoelectric polarization even when impurities are not doped. Thus, an FET using the GaN-based nitride semiconductor tends to become a depression (normally-on) FET, and hardly becomes an enhancement (normally-off) FET. However, normally-off devices are generally used in the field of power electronics, and the devices using the GaN-based nitride semiconductor are required to be normally-off.

The normally-off transistor can be achieved in the following manner. As a first example, part of an AlGaN layer below a gate electrode in an AlGaN/GaN heterostructure is thinned to form a recess. This can reduce a concentration of two-dimensional electron gas (2DEG), and can shift a threshold voltage of the transistor to positive, thereby providing the normally-off transistor. As a second example, a {11-20}-oriented GaN layer is grown on a {10-12}-oriented principal surface of a sapphire substrate to prevent polarization field in a direction perpendicular to the principal surface of the sapphire substrate. This can provide the normally-off transistor. A minus sign attached to each miller index of the plane direction indicates inversion of an index following the minus sign.

As a promising structure for achieving the normally-off FET, a junction field effect transistor (JFET) including a p-type AlGaN layer formed in a region for forming a gate electrode has been proposed. In this JFET, the p-type AlGaN layer is connected to an AlGaN barrier layer to increase potential energy of the AlGaN barrier layer and a GaN channel layer. This can reduce the concentration of the two-dimensional electron gas generated below the region for forming the gate electrode. Thus, the JFET can be normally-off.

Another normally-off transistor capable of providing a sufficiently high current density is proposed by Japanese Patent Publication No. 2006-339561.

SUMMARY

In the JFET using a conventional nitride semiconductor, a gate current is increased when a high voltage is applied to a pn junction in a gate region. When a metal-insulator-semiconductor (MIS) structure is provided by forming an insulating film on a semiconductor layer in the gate region to reduce the gate current, trapping and releasing of carriers by an interface state at an interface between the insulator and the semiconductor occurs. This makes transient response characteristics of the transistor unstable.

In view of the foregoing, the present disclosure is directed to a semiconductor device including a normally-off transistor using a nitride semiconductor, and is concerned with reducing the gate current in driving the transistor, and stabilizing the transient response characteristics of the transistor.

In view of the above concerns, the present disclosure provides a semiconductor device with a metal-insulator-metal-semiconductor structure, or a metal-insulator-high carrier concentration semiconductor-semiconductor structure.

Specifically, in view of the above concerns, the present disclosure provides a first semiconductor device including: a substrate; a first nitride semiconductor layer which includes a plurality of nitride semiconductor layers stacked on the substrate, and has a channel region; a second semiconductor layer which is formed on the first nitride semiconductor layer, and has a conductivity type opposite a conductivity type of the channel region; a conductive layer which is in contact with the second semiconductor layer, and includes a metal layer or a high carrier concentration semiconductor layer having a carrier concentration of $1 \times 10^{18}$ cm$^{-3}$ or higher; an insulating layer formed on the conductive layer; a gate electrode formed on the insulating layer; and a source electrode and a drain electrode formed to laterally sandwich the second semiconductor layer.

In the first semiconductor device of the present disclosure, the conductive layer, the insulating layer, and the gate electrode are sequentially formed on the second semiconductor layer. Thus, the first semiconductor device of the present disclosure includes a metal-insulator-metal-semiconductor structure (when the conductive layer is a metal layer), or a metal-insulator-high carrier concentration semiconductor-semiconductor structure (when the conductive layer is a high carrier concentration semiconductor layer). The conductive layer provided between the second semiconductor layer and the insulating layer can reduce trapping and releasing of carriers by an interface state at an interface between the semiconductor and the insulator, thereby reducing a gate current, and stabilizing transient response characteristics of the transistor.

In addition, since the conductivity type of the second semiconductor layer is opposite the conductive type of the channel region, the transistor can be normally-off. Further, high concentration two-dimensional carrier gas can be generated at an interface between a carrier traveling layer and a carrier supply layer in the first nitride semiconductor layer, thereby driving the transistor at a large current.

Thus, the transistor can be provided with a reduced gate current and a low on-resistance, can be driven at a large current, and can be normally-off.

In view of the above concerns, the present disclosure further provides a second semiconductor device including; a substrate; a first nitride semiconductor layer which includes a plurality of nitride semiconductor layers stacked on the substrate, and has a channel region; a second semiconductor layer which is formed on the first nitride semiconductor layer, and has a smaller band gap than an outermost layer in the first nitride semiconductor layer; a conductive layer which is in contact with the second semiconductor layer, and includes a metal layer or a high carrier concentration semiconductor layer having a carrier concentration of $1 \times 10^{18}$ cm$^{-3}$ or higher; an insulating layer formed on the conductive layer; a gate electrode formed on the insulating layer; and a source electrode and a drain electrode formed to laterally sandwich the second semiconductor layer.

In the second semiconductor device of the present disclosure, the conductive layer, the insulating layer, and the gate electrode are sequentially formed on the second semiconductor layer. Thus, the second semiconductor device of the present disclosure includes a metal-insulator-metal-semiconductor structure (when the conductive layer is a metal layer), or a metal-insulator-high carrier concentration semiconductor-semiconductor structure (when the conductive layer is the high carrier concentration semiconductor layer). The conductive layer provided between the second semiconductor layer and the insulating layer can reduce the trapping and releasing of the carriers by the interface state at the interface between the semiconductor and the insulator, thereby reducing the gate current, and stabilizing the transient response characteristics of the transistor.

In addition, the transistor can be normally-off. Further, high concentration two-dimensional gas can be generated at the interface between the carrier traveling layer and the carrier supply layer in the first nitride semiconductor layer, thereby driving the transistor at a large current.

Thus, the transistor can be provided with a reduced gate current and a low on-resistance, can be driven at a large current, and can be normally-off.

The first or second semiconductor device of the present disclosure preferably includes a field plate electrode formed on the insulating layer.

This can reduce a strength of an electric field concentrated on an end of the gate electrode, and can increase a breakdown voltage.

In the first or second semiconductor device of the present disclosure, the field plate electrode is preferably electrically connected to at least one of the gate electrode or the source electrode.

This can make a potential of the field plate electrode equal to a potential of the gate or source electrode.

In the first or second semiconductor device of the present disclosure, the gate electrode is preferably formed on part of the insulating layer on the conductive layer, and the field plate electrode is preferably in contact with a side surface of the gate electrode facing the drain electrode.

In the first or second semiconductor device of the present disclosure, the gate electrode preferably extends from part of the insulating layer on the conductive layer to part of the insulating layer between the second semiconductor layer and the drain electrode.

Since the gate electrode extends from a gate region to a drain region, the gate electrode can function not only as the gate electrode, but also as the field plate electrode. This can eliminate the step of forming the field plate electrode.

In the first or second semiconductor device of the present disclosure, the source electrode, the drain electrode, and the gate electrode are preferably made of the same material.

In the first or second semiconductor device of the present disclosure, carriers in the channel region are preferably electrons, and the second semiconductor layer is preferably made of a p-type semiconductor.

Since the conductivity type of the second semiconductor layer is opposite the conductivity type of the n-type channel region where electrons are used as the carriers (i.e., p-type), the transistor can be normally-off.

In the first or second semiconductor device of the present disclosure, the carrier traveling layer preferably has a smaller band gap than the carrier supply layer.

This can generate high concentration two-dimensional carrier gas at an interface between the carrier traveling layer and the carrier supply layer, thereby driving the transistor at a large current.

In the disclosed semiconductor device, the conductive layer, the insulating layer, and the gate electrode are sequentially formed on the second semiconductor layer. This can reduce the gate current, and can stabilize the transient response characteristics of the transistor. Thus, the transistor can be provided with a reduced gate current and a low on-resistance, can be driven at a large current, and can be normally-off.

DETAILED DESCRIPTION

Embodiments of the present disclosure will be described below with reference to the drawings.

First Embodiment

Figure 1:
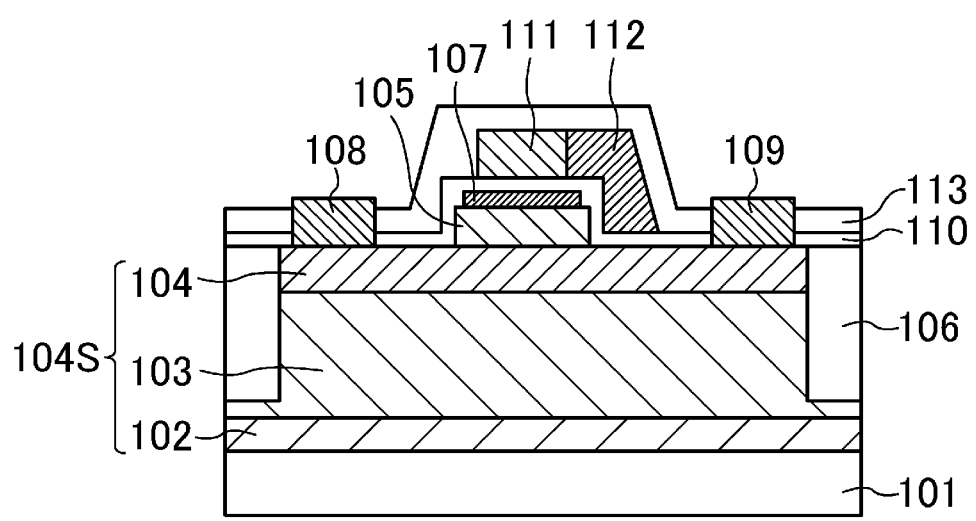
FIG. 1 is a cross-sectional view illustrating a semiconductor device according to a first embodiment of the present disclosure.

A semiconductor device according to the first embodiment of the present disclosure will be described with reference to FIG. 1. FIG. 1 is a cross-sectional view illustrating the semiconductor device of the first embodiment of the present disclosure.

As shown in FIG. 1, a buffer layer 102 which is about 100 nm thick and is made of an aluminum nitride (AlN) layer, an undoped gallium nitride (GaN) layer 103 which is about 2 μm thick, an undoped aluminum gallium nitride (AlGaN) layer 104 which is about 25 nm thick, and a p-type AlGaN layer 105 which is about 150 nm thick are sequentially epitaxially grown on a (0001)-oriented principle surface of a sapphire substrate 101. The term "undoped" in the description designates that the layer is not intentionally doped with impurities.

The undoped GaN layer 103 may be made of $Al_xGa_{1-x}N$ (where x is 0≤x≤1), the undoped AlGaN layer 104 may be made of $Al_yGa_{1-y}N$ (where y is 0<y≤1, y>x), and the p-type AlGaN layer 105 may be made of $Al_zGa_{1-z}N$ (where z is 0≤z≤1). In the present embodiment, for example, GaN (x=0) is used as the undoped GaN layer 103, $Al_{0.2}Ga_{0.8}N$ (y=0.2) is used as the undoped AlGaN layer 104, and $Al_{0.2}Ga_{0.8}N$ (z=0.2) is used as the p-type AlGaN layer 105.

A metal layer 107 made of a palladium (Pd) layer which is about 20 nm thick, or a tungsten silicide (WSi) layer which is about 20 nm thick is formed on the p-type AlGaN layer 105.

A source electrode 108 and a drain electrode 109 made of titanium (Ti)/aluminum (Al) are formed on the undoped AlGaN layer 104 to laterally sandwich the p-type AlGaN layer 105.

An insulating layer 110 which is about 20 nm thick and is made of silicon nitride (SiN) is formed on the undoped AlGaN layer 104 to expose upper surfaces of the source electrode 108 and the drain electrode 109, and cover the p-type AlGaN layer 105 and the metal layer 107.

A gate electrode 111 made of nickel (Ni)/gold (Au) is formed on the insulating layer 110 on the metal layer 107. A field plate electrode 112 made of Au is formed on the insulating layer 110 to be in contact with a side surface of the gate electrode 111 facing the drain electrode. The field plate electrode 112 is electrically connected to the gate electrode 111.

A protective film 113 which is about 200 nm thick and is made of SiN is formed on the insulating layer 110 to expose the upper surfaces of the source electrode 108 and the drain electrode 109, and cover the gate electrode 111 and the field plate electrode 112.

Non-conductive impurities, such as argon (Ar), are implanted in a region outside a region including the source electrode 108, the drain electrode 109, and the gate electrode 111 to reach an upper portion of the undoped GaN layer 103 through the undoped AlGaN layer 104. Thus, a high resistance (i.e., insulating, or non-conductive) ion-implanted region 106, or a non-conductive impurity region containing the non-conductive impurities, is formed.

In this way, a first nitride semiconductor layer 104S including the sequentially stacked AlN buffer layer 102, undoped GaN layer 103, and undoped AlGaN layer 104 is formed on the substrate 101. The first nitride semiconductor layer 104S includes an n-type channel region (a two-dimensional electron gas layer) which is located below the p-type AlGaN layer 105, and in which electrons are used as carriers. A p-type AlGaN layer (a second semiconductor layer) 105 having a conductivity type opposite the conductivity type of the n-type channel region is formed on the first nitride semiconductor layer 104S.

A conductive layer made of the metal layer 107 is formed on the p-type AlGaN layer 105, and the insulating layer 110 is formed on the conductive layer. The gate electrode 111 is formed on part of the insulating layer 110 on the metal layer 107. Thus, the gate electrode 111, the insulating layer 110, the metal layer 107, and the p-type AlGaN layer 105 are sequentially formed, thereby providing the disclosed semiconductor device with a metal-insulator-metal-semiconductor structure.

The first nitride semiconductor layer 104S includes a carrier traveling layer (i.e., the undoped GaN layer 103), and a carrier supply layer (i.e., the undoped AlGaN layer 104). The undoped GaN layer 103 has a smaller band gap than the undoped AlGaN layer 104.

In the present embodiment, the metal layer 107 provided between the p-type AlGaN layer 105 and the insulating layer 110 can reduce trapping and releasing of carriers by an interface state at an interface between the semiconductor and the insulator, and can stabilize transient response characteristics of the transistor.

In addition, since the p-type AlGaN layer 105 has the conductivity type opposite the conductivity type of the channel region, the transistor can be normally-off. Further, high concentration two-dimensional electron gas can be generated at an interface between the undoped GaN layer 103 and the undoped AlGaN layer 104 in the first nitride semiconductor layer 104S, thereby driving the transistor at a large current.

Thus, the transistor can be provided with a reduced gate current and a low on-resistance, can be driven at a large current, and can be normally-off.

A method for fabricating the semiconductor device of the first embodiment of the present disclosure will be described below. First to third methods will be described as examples of the method for fabricating the semiconductor device of the present embodiment. As described later, for example, a semiconductor device including a metal layer 107X made of Pd is fabricated by the first method, and a semiconductor device including a metal layer 107Y made of WSi is fabricated by the second and third methods.

<First Method>

The first method for fabricating the semiconductor device of the first embodiment of the present disclosure will be described with reference to FIGS. 2A-2B, and FIGS. 3A-3B. FIGS. 2A-3B are cross-sectional views sequentially illustrating steps of the first method for fabricating the semiconductor device of the first embodiment of the present disclosure.

Figure 2A:
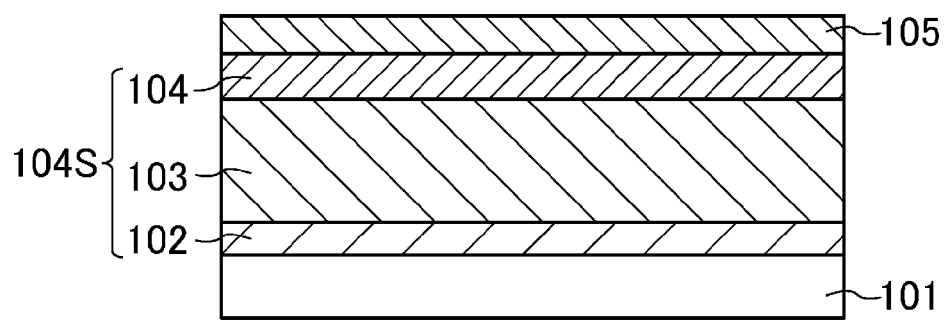
FIGS. 2A-2B are cross-sectional views illustrating steps of a first method for fabricating the semiconductor device of the first embodiment of the present disclosure.

As shown in FIG. 2A, an AlN buffer layer 102 which is about 100 nm thick, an undoped GaN layer 103 which is about 2 μm thick, an undoped AlGaN layer 104 which is about 25 nm thick, and a p-type AlGaN layer 105 which is about 100 nm thick are sequentially formed on a (0001)-oriented surface of a sapphire substrate 101 by, for example, metal organic chemical vapor deposition (MOCVD).

Figure 2B:
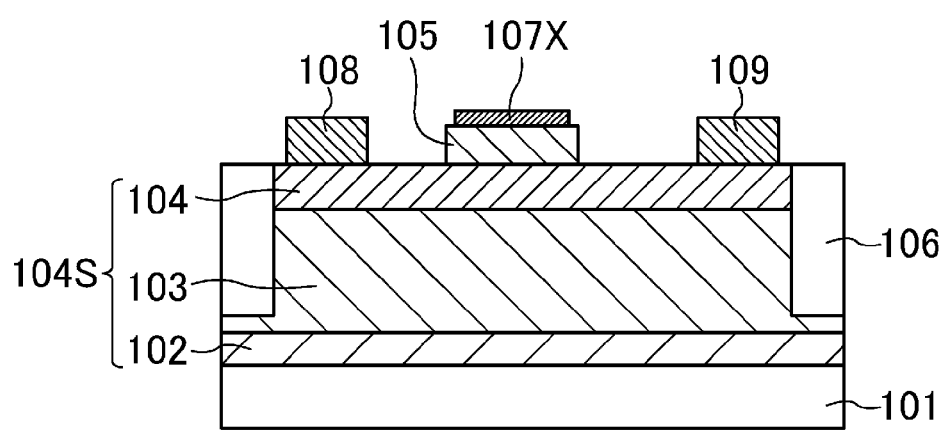

As shown in FIG. 2B, the p-type AlGaN layer 105 is selectively removed from a region except for a gate region by dry etching, such as inductive coupled plasma (ICP) etching.

Then, a photoresist (not shown) is formed on the undoped AlGaN layer 104 to cover a predetermined region (i.e., a region including a source electrode, a drain electrode, and a gate electrode formed in later steps). Using the photoresist as a mask, non-conductive impurities, such as Ar etc., are implanted in the undoped AlGaN layer 104 and the undoped GaN layer 103 by ion implantation to form an ion-implanted region 106. In this step, an acceleration energy and a dosage of the impurities are controlled in such a manner that ions are implanted in an upper portion of the undoped GaN layer 103 through the undoped AlGaN layer 104. Thus, the undoped GaN layer 103 and the undoped AlGaN layer 104 are partially ion-implanted to form the high resistance ion-implanted region 106. Then, the photoresist is removed.

A metal layer 107X which is about 20 nm thick and is made of palladium (Pd) is then formed on the p-type AlGaN layer 105 by, for example, electron beam vapor deposition. Then, a source electrode 108 and a drain electrode 109 made of Ti/Al are formed on the undoped AlGaN layer 104 to laterally sandwich the p-type AlGaN layer 105 and the metal layer 107X.

Figure 3A:
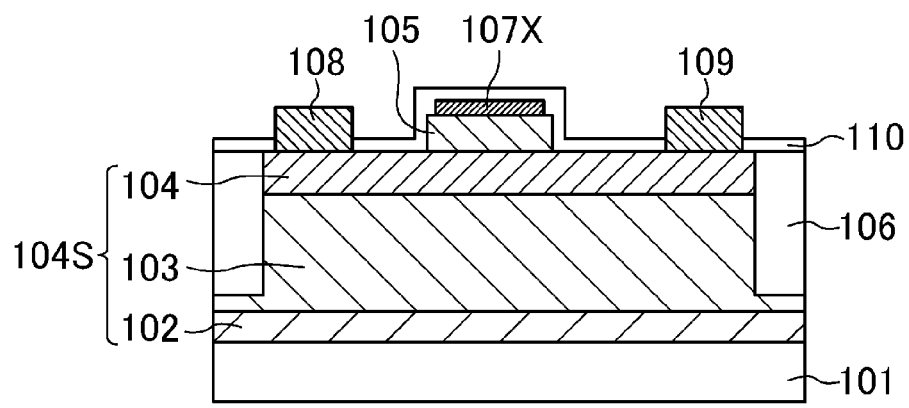
FIGS. 3A-3B are cross-sectional views illustrating steps of the first method for fabricating the semiconductor device of the first embodiment of the present disclosure.

As shown in FIG. 3A, an insulating layer 110 which is about 20 nm thick and is made of SiN is formed on the undoped AlGaN layer 104 to expose upper surfaces of the source electrode 108 and the drain electrode 109, and cover the p-type AlGaN layer 105 and the metal layer 107X by, for example, plasma CVD.

Figure 3B:
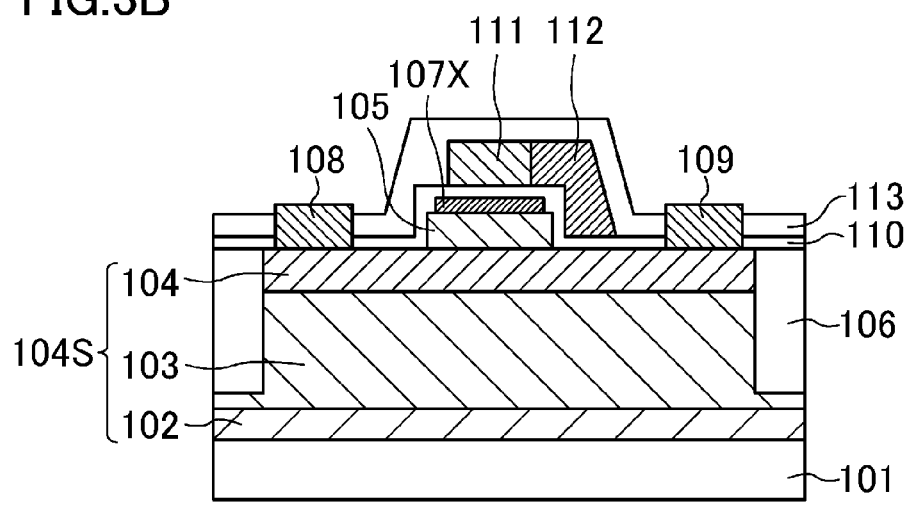

As shown in FIG. 3B, a gate electrode 111 made of Ni/Au is formed on part of the insulating layer 110 on the metal layer 107X. A field plate electrode 112 made of Au is formed on the insulating layer 110 to be in contact with a side surface of the gate electrode 111 facing the drain electrode.

Then, a protective film 113 which is about 200 nm thick and is made of SiN is formed on the insulating layer 110 to expose the upper surfaces of the source electrode 108 and the drain electrode 109, and cover the gate electrode 111 and the field plate electrode 112 by, for example, plasma CVD.

In this way, a semiconductor device including the metal layer 107X made of Pd can be fabricated.

<Second Method>

The second method for fabricating the semiconductor device of the first embodiment of the present disclosure will be described with reference to FIGS. 4A-4C and FIGS. 5A-5C. FIGS. 4A-5C are cross-sectional views sequentially illustrating steps of the second method for fabricating the semiconductor device of the first embodiment of the present disclosure.

Figure 4A:
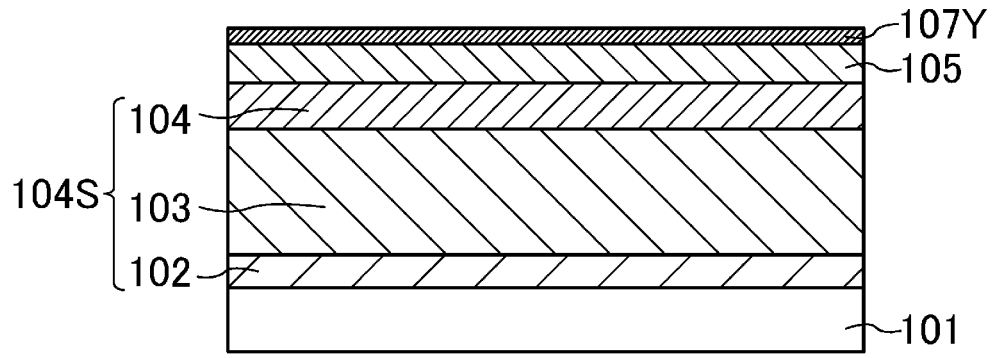
FIGS. 4A-4C are cross-sectional views illustrating steps of a second method for fabricating the semiconductor device of the first embodiment of the present disclosure.

As shown in FIG. 4A, an AlN buffer layer 102 which is about 100 nm thick, an undoped GaN layer 103 which is about 2 µm thick, an undoped AlGaN layer 104 which is about 25 nm thick, and a p-type AlGaN layer 105 which is about 100 nm thick are sequentially formed on a (0001)-oriented surface of a sapphire substrate 101 by, for example, MOCVD.

Then, a metal layer 107Y which is about 20 nm thick and is made of WSi is formed on the p-type AlGaN layer 105 by, for example, sputtering.

Figure 4B:
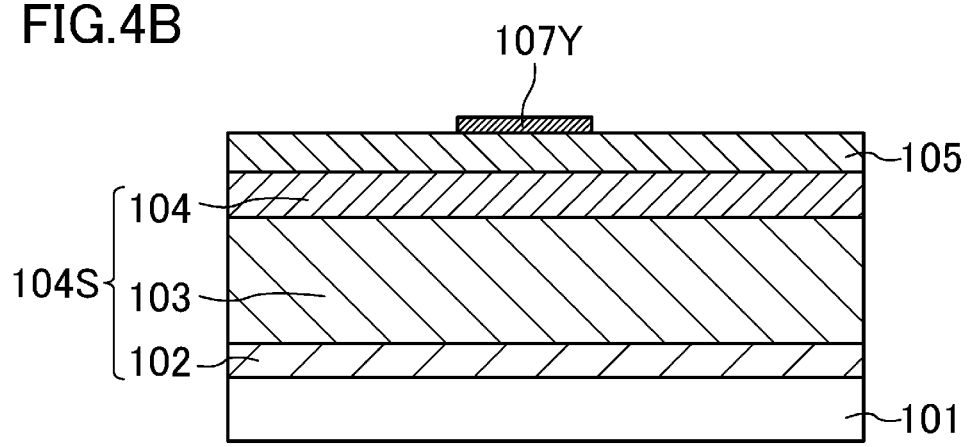

As shown in FIG. 4B, the metal layer 107Y is selectively removed from a region except for a gate region by dry etching to expose the p-type AlGaN layer 105 in the region except for the gate region.

Figure 4C:
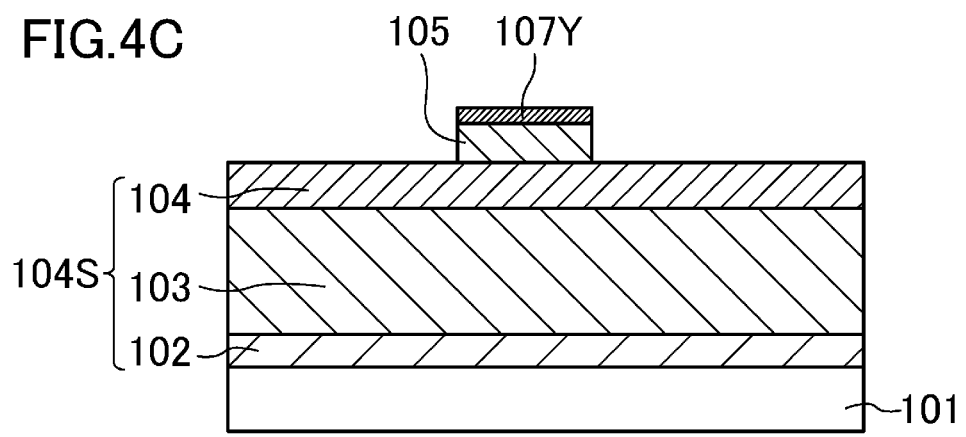

As shown in FIG. 4C, the p-type AlGaN layer 105 is selectively removed from the region except for the gate region by dry etching, such as ICP etching etc., using the metal layer 107Y as a mask.

Figure 5A:
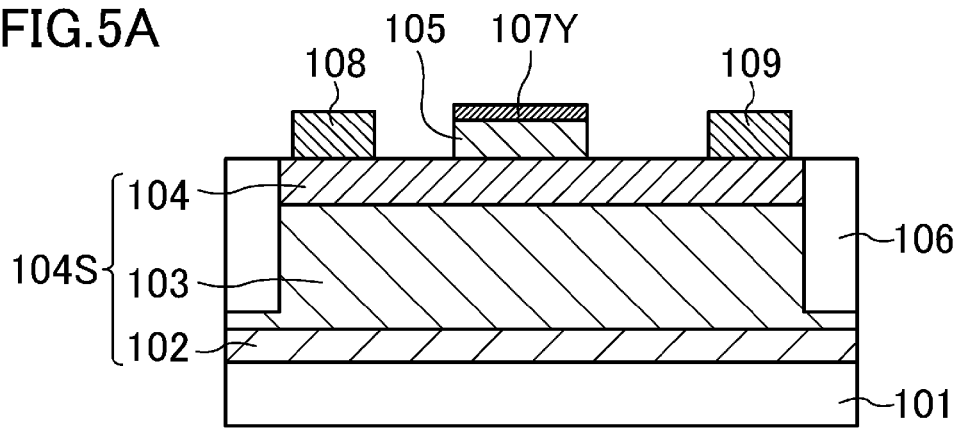
FIGS. 5A-5C are cross-sectional views illustrating steps of the second method for fabricating the semiconductor device of the first embodiment of the present disclosure.

As shown in FIG. 5A, a photoresist (not shown) is formed on the undoped AlGaN layer 104 to cover a predetermined region (i.e., a region including a source electrode, a drain electrode, and a gate electrode formed in later steps). Using the photoresist as a mask, non-conductive impurities, such as Ar etc., are implanted in the undoped AlGaN layer 104 and the undoped GaN layer 103 by ion implantation to form an ion-implanted region 106. Thus, the undoped GaN layer 103 and the undoped AlGaN layer 104 are partially ion-implanted to form the high resistance ion-implanted region 106. Then, the photoresist is removed.

A source electrode 108 and a drain electrode 109 made of Ti/Al are formed on the undoped AlGaN layer 104 to laterally sandwich the p-type AlGaN layer 105 and the metal layer 107Y.

Figure 5B:
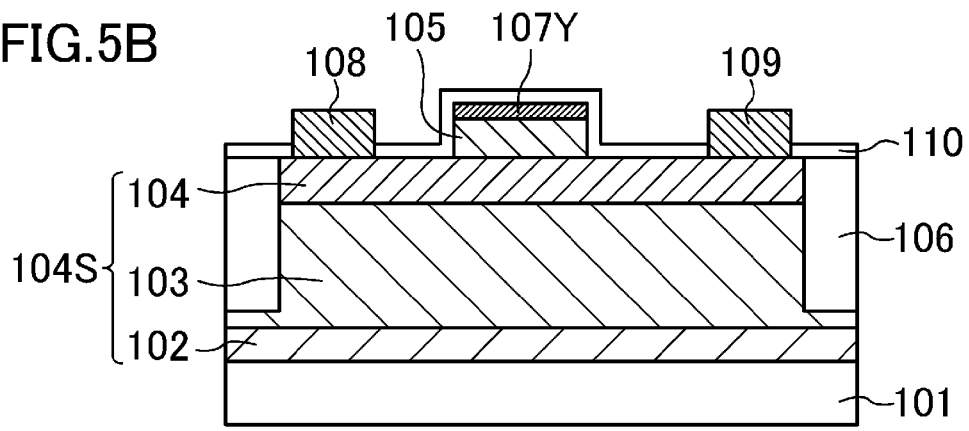

As shown in FIG. 5B, an insulating layer 110 which is about 20 nm thick and is made of SiN is formed on the undoped AlGaN layer 104 to expose upper surfaces of the source electrode 108 and the drain electrode 109, and cover the p-type AlGaN layer 105 and the metal layer 107Y, for example, by plasma CVD.

Figure 5C:
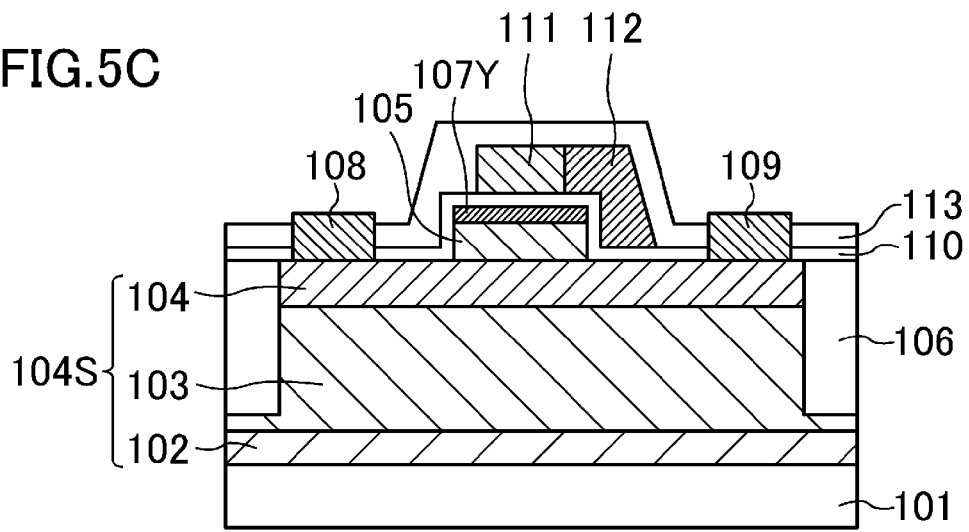

As shown in FIG. 5C, a gate electrode 111 made of Ni/Au is formed on part of the insulating layer 110 on the metal layer 107Y. A field plate electrode 112 made of Au is formed on the insulating layer 110 to be in contact with a side surface of the gate electrode 111 facing the drain electrode.

Then, a protective film 113 which is about 200 nm thick and is made of SiN is formed on the insulating layer 110 to expose the upper surfaces of the source electrode 108 and the drain electrode 109, and cover the gate electrode 111 and the field plate electrode 112 by, for example, plasma CVD.

In this way, a semiconductor device including the metal layer 107Y made of WSi can be fabricated.

<Third Method>

The third method for fabricating the semiconductor device of the first embodiment of the present disclosure will be described with reference to FIGS. 6A-6C and FIGS. 7A-7C. FIGS. 6A-7C are cross-sectional views sequentially illustrating steps of the third method for fabricating the semiconductor device of the first embodiment of the present disclosure.

Figure 6A:
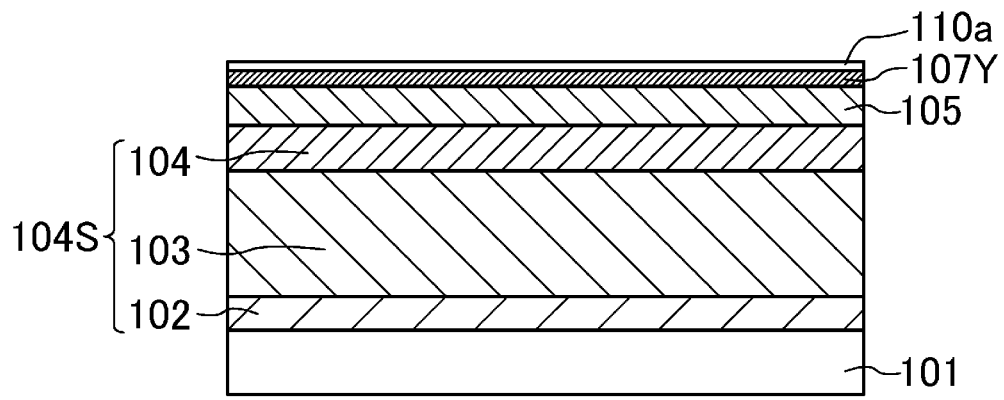
FIGS. 6A-6C are cross-sectional views illustrating steps of a third method for fabricating the semiconductor device of the first embodiment of the present disclosure.

As shown in FIG. 6A, an AlN buffer layer 102 which is about 100 nm thick, an undoped GaN layer 103 which is about 2 µm thick, an undoped AlGaN layer 104 which is about 25 nm thick, and a p-type AlGaN layer 105 which is about 100 nm thick are sequentially formed on a (0001)-oriented surface of a sapphire substrate 101 by, for example, MOCVD.

Then, a metal layer 107Y which is about 20 nm thick and is made of WSi is formed on the p-type AlGaN layer 105 by, for example, sputtering. Then, an insulating layer 110a which is about 20 nm thick and is made of SiN is formed on the metal layer 107Y by, for example, plasma CVD.

Figure 6B:
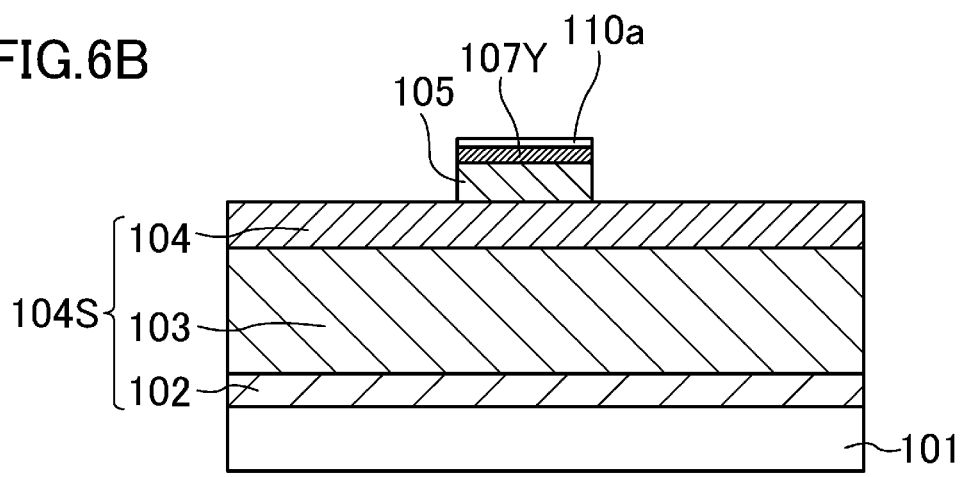

As shown in FIG. 6B, the insulating layer 110a, the metal layer 107Y, and the p-type AlGaN layer 105 are selectively removed from a region except for a gate region by dry etching, such as ICP etching etc.

Figure 6C:
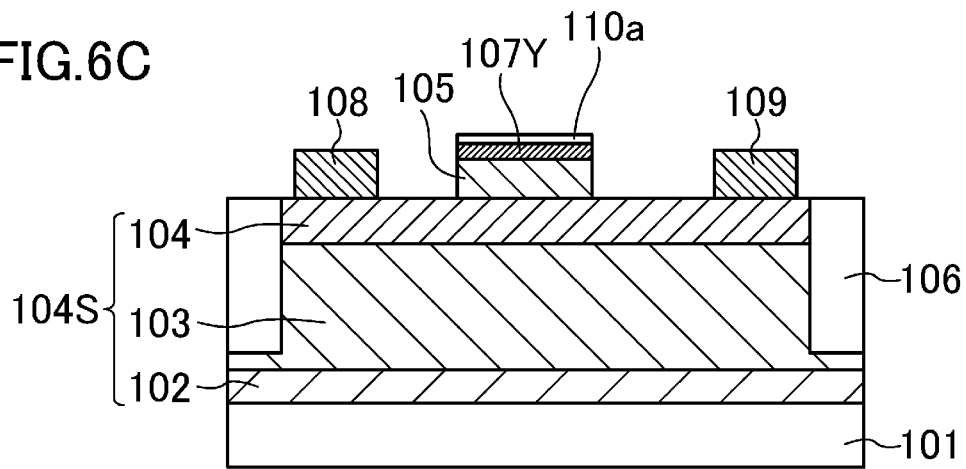

As shown in FIG. 6C, a photoresist (not shown) is formed on the undoped AlGaN layer 104 to cover a predetermined region (i.e., a region including a source electrode, a drain electrode, and a gate electrode formed in later steps). Using the photoresist as a mask, non-conductive impurities, such as Ar etc., are implanted in the undoped AlGaN layer 104 and the undoped GaN layer 103 by ion implantation to form an ion-implanted region 106. Thus, the undoped GaN layer 103 and the undoped AlGaN layer 104 are partially ion-implanted to form the high resistance ion-implanted region 106. Then, the photoresist is removed.

A source electrode 108 and a drain electrode 109 made of Ti/Al are formed on the undoped AlGaN layer 104 to laterally sandwich the p-type AlGaN layer 105 and the metal layer 107Y and the insulating layer 110a.

Figure 7A:
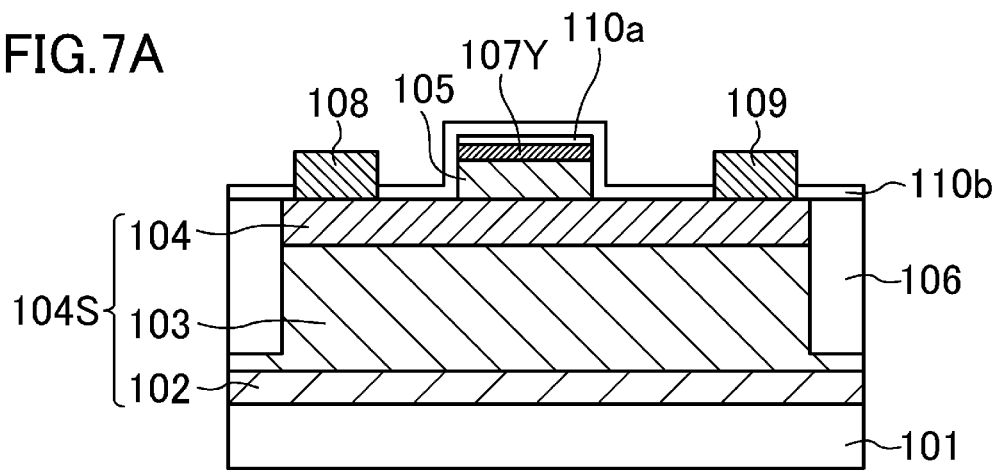
FIGS. 7A-7C are cross-sectional views illustrating steps of the third method for fabricating the semiconductor device of the first embodiment of the present disclosure.

As shown in FIG. 7A, an insulating layer 110b which is about 20 nm thick and is made of SiN is formed on the undoped AlGaN layer 104 to expose upper surfaces of the source electrode 108 and the drain electrode 109, and cover the p-type AlGaN layer 105, the metal layer 107Y, and the insulating layer 110a by, for example, plasma CVD.

Figure 7B:
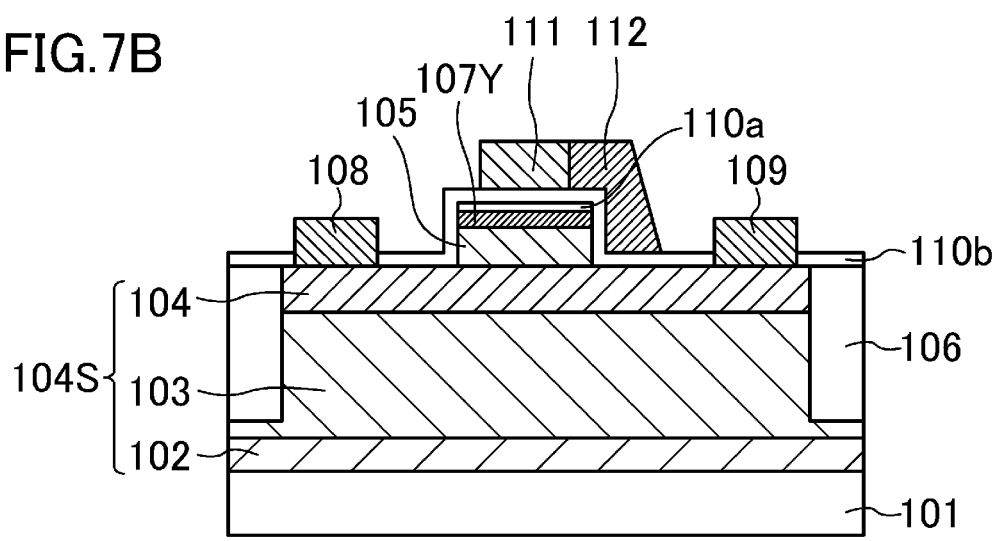

As shown in FIG. 7B, a gate electrode 111 made of Ni/Au is formed on part of the insulating layer 110b on the insulating layer 110a. A field plate electrode 112 made of Au is formed on the insulating layer 110b to be in contact with a side surface of the gate electrode 111 facing the drain electrode.

Figure 7C:
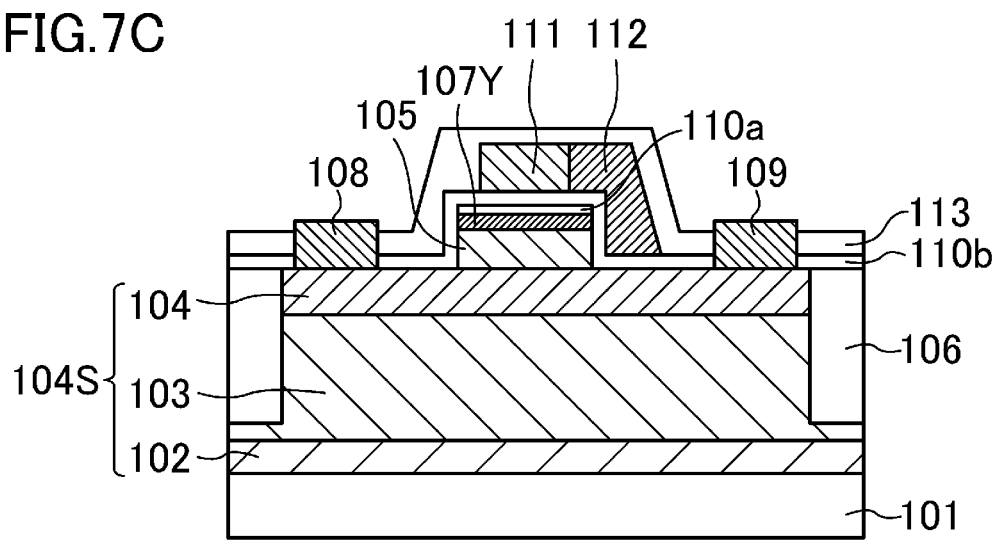

As shown in FIG. 7C, a protective film 113 which is about 200 nm thick and is made of SiN is formed on the insulating layer 110b to expose the upper surfaces of the source electrode 108 and the drain electrode 109, and cover the gate electrode 111 and the field plate electrode 112 by, for example, plasma CVD.

In this way, a semiconductor device including the metal layer 107Y made of WSi can be fabricated.

The first to third methods have the following features.

In the first method, the p-type AlGaN layer 105 is patterned by etching, and then the metal layer 107X made of Pd is formed on the patterned p-type AlGaN layer 105.

In the second method, the metal layer 107Y made of WSi is formed on the p-type AlGaN layer 105, and the metal layer 107Y is patterned by etching before patterning the p-type AlGaN layer 105 by etching. Then, the p-type AlGaN layer 105 is patterned by etching using the patterned metal layer 107Y as a mask.

In the third method, the metal layer 107Y made of WSi, and the insulating layer 110a made of SiN are sequentially formed on the p-type AlGaN layer 105 before patterning the p-type AlGaN layer 105 by etching. Then, the insulating layer 110a, the metal layer 107Y, and the p-type AlGaN layer 105 are sequentially patterned by etching.

Alternative of First Embodiment

Figure 8:
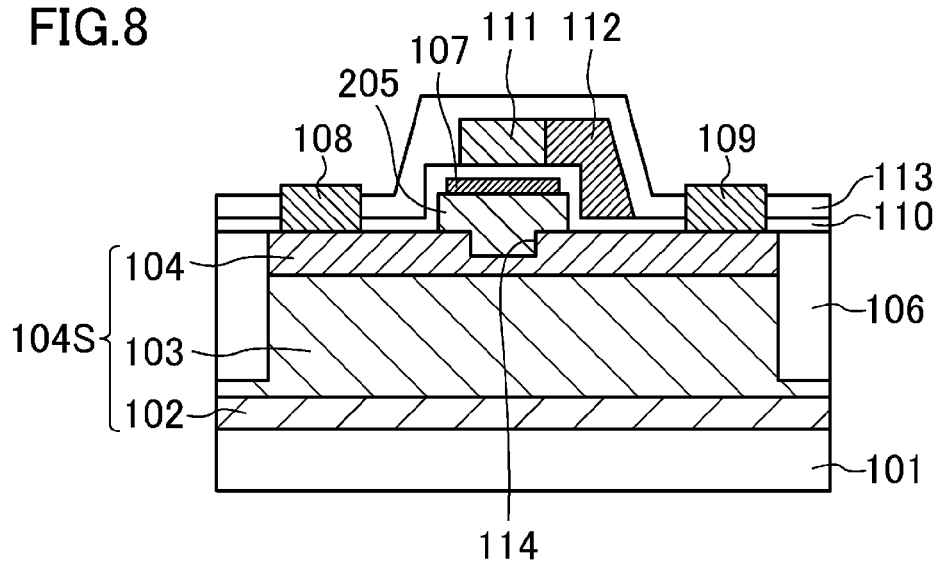
FIG. 8 is a cross-sectional view illustrating a semiconductor device according to an alternative of the first embodiment of the present disclosure.

A semiconductor device according to an alternative of the first embodiment of the present disclosure will be described with reference to FIG. 8. FIG. 8 is a cross-sectional view illustrating the semiconductor device according to the alternative of the first embodiment of the present disclosure. In FIG. 8, the same components as those of the first embodiment will be indicated by the same reference characters. Thus, the same features as those of the first embodiment are not described in detail in this alternative.

This alternative has the following features. In this alternative, as shown in FIG. 8, a recess 114 is formed in the undoped AlGaN layer 104 in the gate region, and a p-type AlGaN layer 205 is formed to fill the recess 114.

This alternative can provide advantages similar to those of the first embodiment.

With the recess 114 formed in the undoped AlGaN layer 104 in the gate region, the undoped AlGaN layer 104 can be thickened in the region except for the gate region. This can increase a distance between an upper surface of the undoped AlGaN layer 104 in the region except for the gate region and a two-dimensional electron gas layer immediately below the undoped AlGaN layer 104 (i.e., a two-dimensional electron gas layer at an interface between the undoped GaN layer 103 and the undoped AlGaN layer 104). Thus, a phenomenon called current collapse (reduction in current due to trapping of electrons by an interface state between the gate and the source, or the gate and the drain) can be reduced.

A method for fabricating the semiconductor device according to the alternative of the first embodiment of the present disclosure will be described with reference to FIGS. 9A-9B and FIGS. 10A-10B. FIGS. 9A-10B are cross-sectional views sequentially illustrating steps of the method for fabricating the semiconductor device according to the alternative of the first embodiment of the present disclosure.

Figure 9A:
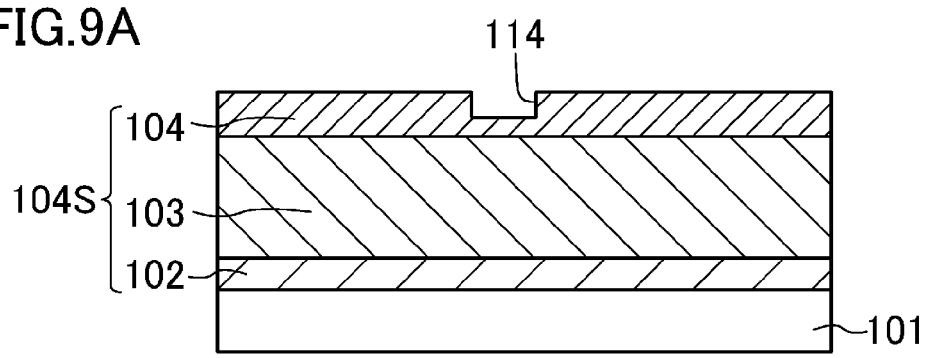
FIGS. 9A-9B are cross-sectional views illustrating steps of a method for fabricating the semiconductor device according to the alternative of the first embodiment of the present disclosure.

As shown in FIG. 9A, an AlN buffer layer 102 which is about 100 nm thick, an undoped GaN layer 103 which is about 2 μm thick, and an undoped AlGaN layer 104 which is about 25 nm thick are sequentially formed on a (0001)-oriented surface of a sapphire substrate 101 by, for example, MOCVD.

Then, a recess 114 is formed in the undoped AlGaN layer 104 in a gate region by dry etching, for example, ICP etching, etc.

Figure 9B:
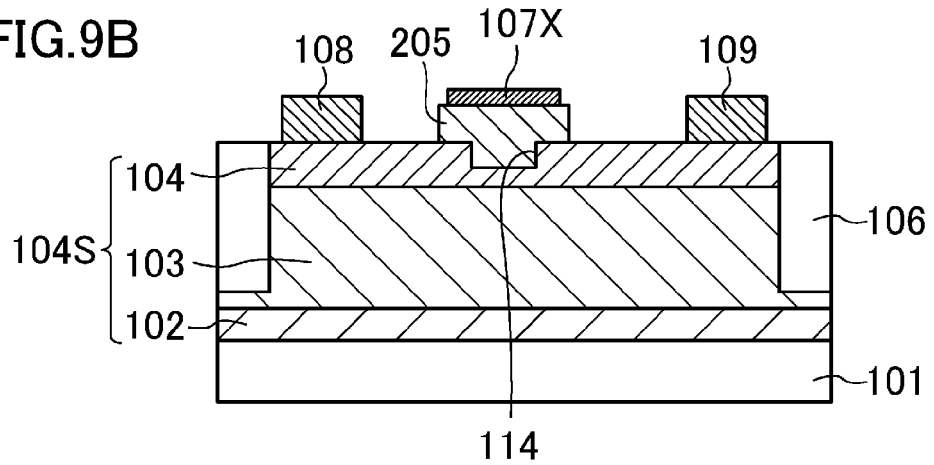

As shown in FIG. 9B, a p-type AlGaN layer 205 which is about 100 nm thick is selectively formed on the undoped AlGaN layer 104 in the gate region by, for example, MOCVD, to fill the recess 114.

Then, a photoresist (not shown) is formed on the undoped AlGaN layer 104 to cover a predetermined region (i.e., a region including a source electrode, a drain electrode, and a gate electrode formed in later steps). Using the photoresist as a mask, non-conductive impurities, such as Ar etc., are implanted in the undoped AlGaN layer 104 and the undoped GaN layer 103 by ion implantation to form an ion-implanted region 106. In this step, an acceleration energy and a dosage of the impurities are controlled in such a manner that ions are implanted in an upper portion of the undoped GaN layer 103 through the undoped AlGaN layer 104. Thus, the undoped GaN layer 103 and the undoped AlGaN layer 104 are partially ion-implanted to form the high resistance ion-implanted region 106. Then, the photoresist is removed.

Then, a metal layer 107X which is about 20 nm thick and is made of Pd is formed on the p-type AlGaN layer 205 by, for example, electron beam vapor deposition.

Then, a source electrode 108 and a drain electrode 109 made of Ti/Al are formed on the undoped AlGaN layer 104 to laterally sandwich the p-type AlGaN layer 205 and the metal layer 107X.

Figure 10A:
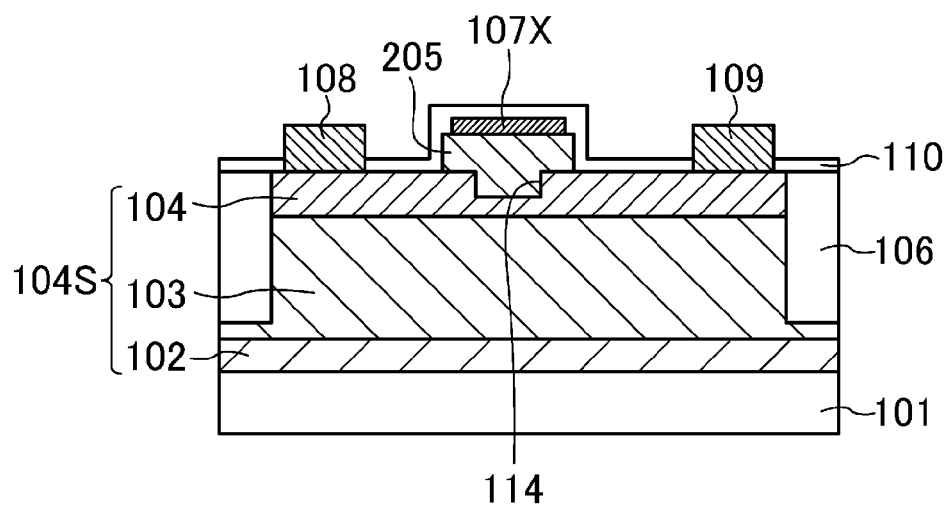
FIGS. 10A-10B are cross-sectional views illustrating steps of the method for fabricating the semiconductor device according to the alternative of the first embodiment of the present disclosure.

As shown in FIG. 10A, an insulating layer 110 which is about 20 nm thick and is made of SiN is formed on the undoped AlGaN layer 104 to expose upper surfaces of the source electrode 108 and the drain electrode 109, and cover the p-type AlGaN layer 205 and the metal layer 107X by, for example, plasma CVD.

Figure 10B:
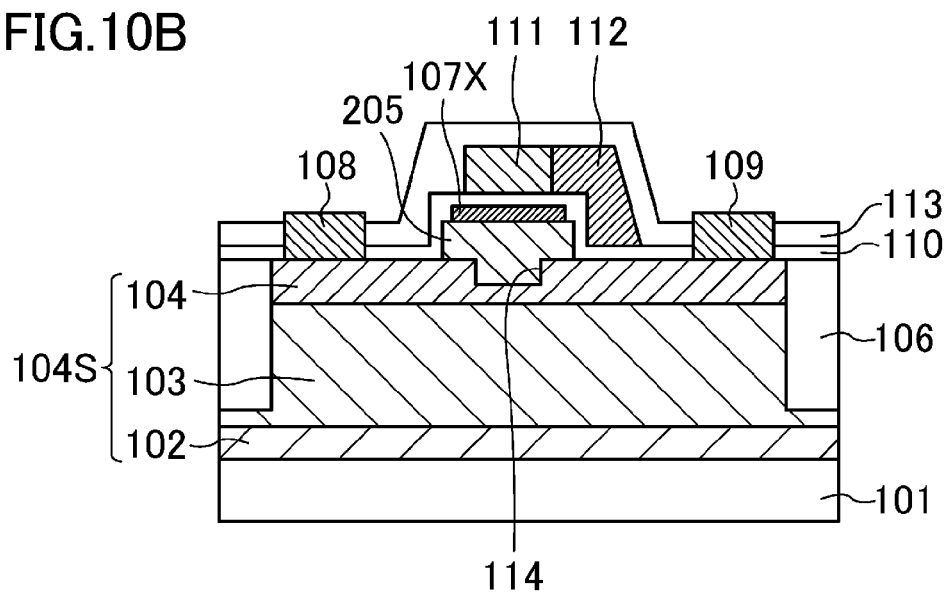

As shown in FIG. 10B, a gate electrode 111 made of Ni/Au is formed on part of the insulating layer 110 on the metal layer 107X. A field plate electrode 112 made of Au is formed on the insulating layer 110 to be in contact with a side surface of the gate electrode 111 facing the drain electrode.

Then, a protective film 113 which is about 200 nm thick and is made of SiN is formed on the insulating layer 110 to expose the upper surfaces of the source electrode 108 and the drain electrode 109, and cover the gate electrode 111 and the field plate electrode 112 by, for example, plasma CVD.

In this way, the semiconductor device of the alternative can be fabricated.

In the first embodiment and the alternative, as shown in FIGS. 1 and 8, the field plate electrode 112 is electrically connected to the gate electrode 111. However, the present disclosure is not limited to this example. For example, the field plate electrode may not electrically be connected to the gate electrode, but to the source electrode. Alternatively, the field plate electrode may electrically be connected to both of the gate and source electrodes. That is, the field plate electrode may electrically be connected to at least one of the gate electrode or the source electrode.

In this alternative, as shown in FIG. 9A, the recess 114 is formed in the undoped AlGaN layer 104, the p-type AlGaN layer 205 is formed to fill the recess 114 as shown in FIG. 9B, and then the same steps as those of the first method shown in FIGS. 2B-3B are sequentially performed (i.e., the semiconductor device is fabricated by the first method of the first embodiment). However, the present disclosure is not limited to this example. For example, the semiconductor device of this alternative may be fabricated by the second or third method of the first embodiment.

Second Embodiment

Figure 11:
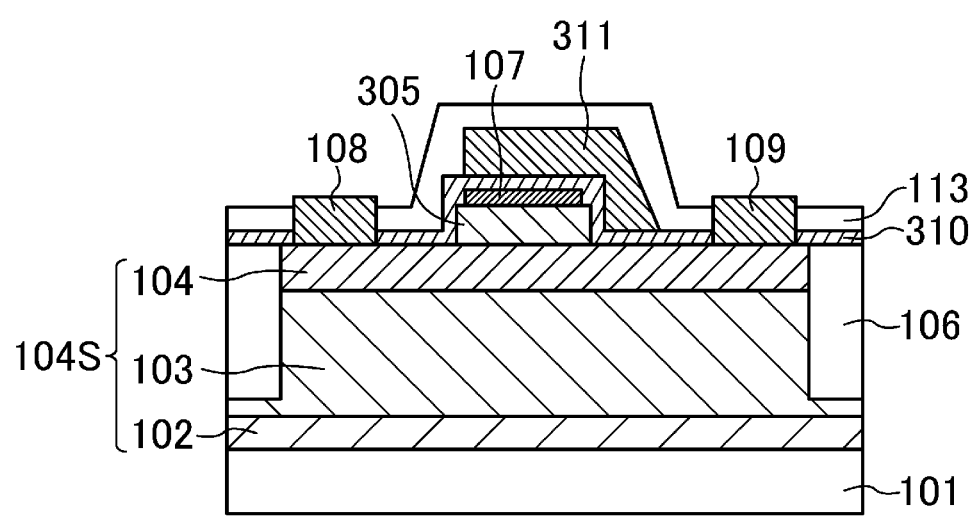
FIG. 11 is a cross-sectional view illustrating a semiconductor device according to a second embodiment of the present disclosure.

A semiconductor device according to a second embodiment of the present disclosure will be described with reference to FIG. 11. FIG. 11 is a cross-sectional view of the semiconductor device of the second embodiment of the present disclosure. In FIG. 11, the same components as those of the first embodiment will be indicated by the same reference numerals as those shown in FIG. 1. Thus, the same features as those of the first embodiment are not described in detail in the second embodiment.

As shown in FIG. 11, an AlN buffer layer 102 which is about 100 nm thick, an undoped GaN layer 103 which is about 2 μm thick, and an undoped AlGaN layer 104 which is about 25 nm thick are sequentially epitaxially grown on a (0001)-oriented surface of a sapphire substrate 101.

The undoped GaN layer 103 may be made of $Al_xGa_{1-x}N$ (where x is 0≤x≤1), and the undoped AlGaN layer 104 may be made of $Al_yGa_{1-y}N$ (where y is 0<y≤1, y>x). In the present embodiment, the undoped GaN layer 103 is made of GaN (x=0), and the undoped AlGaN layer 104 is made of $Al_{0.2}Ga_{0.8}N$ (y=0.2).

A p-type nickel oxide (NiO) layer 305 which is about 100 nm thick is selectively formed on the undoped AlGaN layer 104 in a gate region.

A metal layer 107 made of a Pd layer which is about 20 nm thick, or a WSi layer which is about 20 nm thick is formed on the p-type NiO layer 305.

A source electrode 108 and a drain electrode 109 made of Ti/Al is formed on the undoped AlGaN layer 104 to laterally sandwich the p-type NiO layer 305.

An insulating layer 310 which is about 20 nm thick and is made of aluminum oxide ($Al_2O_3$) is formed on the undoped AlGaN layer 104 to expose upper surfaces of the source electrode 108 and the drain electrode 109, and cover the p-type NiO layer 305 and the metal layer 107.

A gate electrode 311 made of Ti/Al is formed on the insulating layer 310 to extend from part of the insulating layer 310 on the metal layer 107 to part of the insulating layer 310 between the p-type NiO layer 305 and the drain electrode 109 (i.e., to extend from the gate region to a drain region).

A protective film 113 which is about 200 nm thick and is made of SiN is formed on the insulating layer 310 to expose upper surfaces of the source electrode 108 and the drain electrode 109, and cover the gate electrode 311.

Non-conductive impurities, such as Ar etc., are implanted in a region outside a region including the source electrode 108, the drain electrode 109, and the gate electrode 311 to implant ions in an upper portion of the undoped GaN layer 103 through the undoped AlGaN layer 104. Thus, a high resistance ion-implanted region 106 is formed.

In this way, the AlN buffer layer 102, the undoped GaN layer 103, and the undoped AlGaN layer 104 are sequentially stacked to form a first nitride semiconductor layer 104S on the substrate 101. The first nitride semiconductor layer 104S includes an n-type channel region (a two-dimensional electron gas layer) which is located below the p-type NiO layer 305, and in which electrons are used as carriers. A p-type NiO layer (a second semiconductor layer) 305 having a conductivity type opposite the conductivity type of the n-type channel region is formed on the first nitride semiconductor layer 104S.

A conductive layer made of the metal layer 107 is formed on the p-type NiO layer 305, and the insulating layer 310 is formed on the conductive layer. The gate electrode 111 is formed on the insulating layer 310 to extend from the part of the insulating layer 310 on the metal layer 107 to the part of the insulating layer 310 between the p-type NiO layer 305 and the drain electrode 109. Thus, the gate electrode 311, the insulating layer 310, the metal layer 107, and the p-type NiO layer 305 are sequentially formed, thereby providing the disclosed semiconductor device with a metal-insulator-metal-semiconductor structure.

The first nitride semiconductor layer 104S includes a carrier traveling layer (i.e., the undoped GaN layer 103), and a carrier supply layer (i.e., the undoped AlGaN layer 104). The undoped GaN layer 103 has a smaller band gap than the undoped AlGaN layer 104.

The source electrode 108, the drain electrode 109, and the gate electrode 311 are made of the same material (e.g., Ti/Al).

The present embodiment and first embodiment have the following differences.

First, the p-type NiO layer 305 is used in the present embodiment in place of the p-type AlGaN layer 105 of the first embodiment. Second, the insulating layer 310 made of $Al_2O_3$ is used in the present embodiment in place of the insulating layer 110 made of SiN of the first embodiment. Third, the gate electrode 311 made of Ti/Al is used in the present embodiment in place of the gate electrode 111 made of Ni/Au, and the field plate electrode 112 made of Au of the first embodiment.

The present embodiment can provide advantages similar to those of the first embodiment.

In addition, the source electrode 108, the drain electrode 109, and the gate electrode 311 are made of the same material (e.g., Ti/Al). This can reduce the number of steps for fabricating the semiconductor device. Specifically, the source electrode 108, the drain electrode 109, and the gate electrode 311 are made of the same material, and the semiconductor device can be fabricated in the following manner. This can reduce the number of the fabrication steps.

The AlN buffer layer 102, the undoped GaN layer 103, and the undoped AlGaN layer 104 are sequentially formed on the substrate 101. Then, the p-type NiO layer 305 is formed on the undoped AlGaN layer 104 in the gate region. Then, the metal layer 107 is formed on the p-type NiO layer 305.

Then, the insulating layer 310 is formed on the undoped AlGaN layer 104 to cover the p-type NiO layer 305 and the metal layer 107. Then, the insulating layer 310 is removed from a source region (a region where a source electrode is formed in a later step), and a drain region (a region where a drain electrode is formed in a later step) by, for example, milling, etc. Thus, the undoped AlGaN layer 104 is exposed in the source region and the drain region.

A source electrode 108 is formed on the undoped AlGaN layer 104 in the source region, and a drain electrode 109 is formed on the undoped AlGaN layer 104 in the drain region. simultaneously, the gate electrode 311 is formed on the insulating layer 310 to extend from the part of the insulating layer 310 on the metal layer 107 to the part of the insulating layer 310 between the p-type NiO layer 305 and the drain electrode 109. In this way, the source electrode 108, the drain electrode 109, and the gate electrode 311 made of the same material can be formed in the same step. This can reduce the number of the fabrication steps.

Since the gate electrode 311 is formed to extend from the gate region to the drain region, the gate electrode 311 functions not only as the gate electrode, but also as a field plate electrode. This can eliminate the step of forming the field plate electrode.

In the present embodiment, a method for fabricating the semiconductor device is not described. However, the semiconductor device of the present embodiment can be fabricated by the same method as the first to third methods of the first embodiment. Specifically, in the present embodiment, the gate electrode extending from the gate region to the drain region is formed without forming the field plate electrode in the step of forming the gate electrode and the field plate electrode according to the first embodiment.

In the present embodiment, as shown in FIG. 11, the recess is not formed in the undoped AlGaN layer 104. However, the present disclosure is not limited to this example. For example, like the alternative of the first embodiment, a recess may be formed in the undoped AlGaN layer, and the p-type NiO layer may be formed to fill the recess. This can also provide advantages similar to those of the alternative of the first embodiment.

The sapphire substrate 101 described in the first embodiment, the alternative of the first embodiment, and the second embodiment may be replaced with an Si substrate, an SiC substrate, or a GaN substrate, etc.

In the first embodiment, the alternative of the first embodiment, and the second embodiment, the metal layer 107 is formed to be in contact with an upper surface of the p-type semiconductor layer (i.e., the p-type AlGaN layer 105, 205 of the first embodiment and its alternative, and the p-type NiO layer 305 of the second embodiment). However, the present disclosure is not limited to this example. For example, the metal layer may be formed to extend from the upper surface to a side surface of the p-type semiconductor layer. Alternatively, metal layer may be formed to extend from the upper surface of the p-type semiconductor layer to an upper surface of the undoped AlGaN layer.

In the first embodiment, the alternative of the first embodiment, and the second embodiment, the conductive layer is made of the metal layer, and the metal layer is made of Pd or WSi. However, Pd or WSi may be replaced with, for example, Ni, Ti, Al, etc. A conductive layer made of a high carrier concentration semiconductor layer may be used in place of the conductive layer made of the metal layer. Examples of semiconductor materials constituting the high carrier concentration semiconductor layer include n-type GaN, n-type ZnO, n-type Si, p-type GaN, p-type NiO, p-type Si, etc. The high carrier concentration semiconductor layer may preferably have a carrier concentration of $1\times10^{18}$ cm$^{-3}$ or higher.

In the first embodiment, the alternative of the first embodiment, and the second embodiment, the second semiconductor layer having the conductive type opposite the conductive type of the channel region (i.e., the p-type semiconductor layer) is used as the second semiconductor layer. However, the present disclosure is not limited to this example. For example, an undoped second semiconductor layer having a smaller band gap than an outermost layer in the first nitride semiconductor layer (i.e., a layer in the first nitride semiconductor layer in contact with the second semiconductor layer) may be used.

In semiconductor devices including normally-off transistors using a nitride semiconductor, the present disclosure can reduce a gate current, and can stabilize transient response characteristics of the transistor. Thus, the present disclosure is useful for semiconductor devices including transistors applicable to power transistors used in power supply circuits in consumer products.

What is claimed is:

1. A semiconductor device comprising:
a substrate;
a first nitride semiconductor layer which includes a plurality of nitride semiconductor layers stacked on the substrate, and has a channel region;
a second semiconductor layer which is formed on the first nitride semiconductor layer, and has a conductivity type opposite a conductivity type of the channel region;
a conductive layer which is in contact with the second semiconductor layer, and includes a metal layer or a high carrier concentration semiconductor layer having a carrier concentration of $1\times10^{18}$ cm$^{-3}$ or higher;
an insulating layer formed on the conductive layer;
a gate electrode formed on the insulating layer; and
a source electrode and a drain electrode formed to laterally sandwich the second semiconductor layer,
wherein at least a portion of the gate electrode is formed directly above the conductive layer, and
wherein the insulating layer is arranged between the gate electrode and the conductive layer so that the gate electrode and conductive layer are separated.

2. The semiconductor device of claim 1, further comprising:
a field plate electrode formed on the insulating layer.

3. The semiconductor device of claim 2, wherein
the field plate electrode is electrically connected to at least one of the gate electrode or the source electrode.

4. The semiconductor device of claim 3, wherein
the gate electrode is formed on part of the insulating layer on the conductive layer, and
the field plate electrode is in contact with a side surface of the gate electrode facing the drain electrode.

5. The semiconductor device of claim 1, wherein
the gate electrode extends from part of the insulating layer on the conductive layer to part of the insulating layer between the second semiconductor layer and the drain electrode.

6. The semiconductor device of claim 5, wherein
the source electrode, the drain electrode, and the gate electrode are made of the same material.

7. The semiconductor device of claim 1, wherein
carriers in the channel region are electrons, and
the second semiconductor layer is made of a p-type semiconductor.

8. The semiconductor device of claim 1, wherein
the first nitride semiconductor layer includes a carrier traveling layer and a carrier supply layer, and
the carrier traveling layer has a smaller band gap than the carrier supply layer.

9. The semiconductor device of claim 1, wherein
an entirety of a top surface of the conductive layer is covered by the insulating layer.

10. The semiconductor device of claim 1, further comprising:
a protective film formed on the gate electrode and the insulating layer.

11. The semiconductor device of claim 10, wherein
the protective film is made of SiN.

12. The semiconductor device of claim 10, wherein
an upper surface of the source electrode and an upper surface of the drain electrode are exposed from the protective film.

* * * * *